United States Patent
Fang et al.

(10) Patent No.: US 6,216,099 B1
(45) Date of Patent: *Apr. 10, 2001

(54) TEST SYSTEM AND METHODOLOGY TO IMPROVE STACKED NAND GATE BASED CRITICAL PATH PERFORMANCE AND RELIABILITY

(75) Inventors: Peng Fang, San Jose; Sunil Shabde, Cupertino, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/924,090

(22) Filed: Sep. 5, 1997

(51) Int. Cl.[7] .................................... G06F 17/50
(52) U.S. Cl. .................. 703/15; 716/1; 716/4; 326/121; 257/344; 438/327
(58) Field of Search .......... 395/500.36, 500.35, 395/500.34, 500.05, 500.02; 716/1, 4; 703/13, 14, 15; 326/121, 102, 103, 104; 257/204, 206, 344; 438/327

(56) References Cited

U.S. PATENT DOCUMENTS

| | | | |
|---|---|---|---|
| 5,308,780 | * 5/1994 | Chou et al. | 438/302 |
| 5,426,375 | 6/1995 | Roy et al. | 324/769 |
| 5,508,632 | 4/1996 | Shimizu et al. | 324/769 |
| 5,565,700 | * 10/1996 | Chou et al. | 257/408 |
| 5,587,665 | 12/1996 | Jiang | 326/16 |
| 5,600,578 | 2/1997 | Fang et al. | 703/14 |
| 5,606,518 | * 2/1997 | Fang et al. | 707/13 |
| 5,686,321 | * 11/1997 | Ko et al. | 438/289 |
| 5,925,913 | * 7/1999 | Draper | 257/344 |

OTHER PUBLICATIONS

Fang et al "Circuit Hot Carrier Reliability Simulation in Advanced CMOS Process Technology Development," IEEE, Oct. 1994, pp. 73–78.*

Quader et al "Hot–Carrier–Reliability Design Rules for Translating Device Degradation to CMOS Digital Circuit Degradation," IEEE, May 1994, pp. 681–691.*

Fang et al "Circuit Hot Carrier Reliability Simulation in Advanced CMOS Technology Process Development," IEEE, Oct. 1995, pp. 413–415.*

Hwang et al. "Performance and Reliability Optimization of Ultra Short Channel CMOS Device for Giga–Bit DRAM Applications," IEEE, Dec. 1995, pp. 17.61–17.6.4.*

Dai et al "The Effect of Intrinsic Capacitance Degradation on Circuit Performance," IEEE, Jun. 1996, pp. 196–197.*

Kizilyalli et al "High Performance 3.3– and 5–V 0.5–um CMOS Technology for ASIC's," IEEE, Nov. 1995, pp. 440–448.*

* cited by examiner

Primary Examiner—Matthew Smith
Assistant Examiner—Vuthe Siek

(57) ABSTRACT

A test system and methodology to improve the performance and reliability of critical paths including stacked NAND gates with sub-minimum channel transistors employs one or more inverter based ring oscillators to generate reliability data. The reliability data is used to calibrate an aged transistor model, which describes the hot carrier reliability of sub-minimum channel length transistors. A computer simulation uses the calibrated, aged transistor model to simulate the critical path circuitry including the stacked NAND gates.

12 Claims, 5 Drawing Sheets

TEST SYSTEM AND METHODOLOGY TO IMPROVE STACKED NAND GATE BASED CRITICAL PATH PERFORMANCE AND RELIABILITY

TECHNICAL FIELD

The invention relates to testing integrated circuits and more particularly to evaluating performance and hot carrier reliability of critical path circuitry including transistors of different, very deep sub-micron channel lengths.

BACKGROUND ART

Due to hot carrier effects, which are pronounced in sub-micron geometries, there is a tradeoff between performance and reliability when selecting an appropriate channel length for field-effect transistors, such as MOSFETs or IGFETs. A shorter channel length creates a correspondingly greater electric field between the source and the drain of the transistor, which increases drive current ($I_D$) On one hand, an increased drive current due to a shorter channel length is able to more rapidly charge or discharge the load capacitance of the transistor. Consequently, a circuit including the transistor can run at higher frequencies. On the other hand, an increased electric field, particularly near the drain region, causes an increase in "hot carrier" effects, in which accelerated electrons ionize the silicon lattice, generating pairs of electrons and holes. Over time, these hot carriers break bonds and become trapped, changing electrical properties of the transistor. In NMOS transistors, electron mobility is degraded, causing a reduction in the drive current and hence performance of the transistor.

By industry convention, the lifetime of a transistor is the stress time that elapses until there is a 10% reduction in the drive current due to hot carrier effects. Compensating for the reduction in drive current by increasing the source-to-drain potential difference ($V_{DS}$), however, increases local electric fields and rate of hot carrier degradation.

In order to enhance microprocessor speed, we have been investigating the use of sub-minimum (i.e., very deep sub-micron, around 0.25 micron) channel length transistors in stacked NAND gate circuits, commonly part of a microprocessor's critical path. A critical path of a microprocessor is a series of interconnected gates, registers, and other elements through which a propagation delay is determinative of the processing speed of the microprocessor. Therefore, reducing the propagation delay of any element, for example, a NAND gate, in the critical path enables the microprocessor to execute at higher speeds.

Referring to FIG. 1, depicted is a three-input stacked NAND gate 100 implemented in CMOS technology, comprising three PMOS transistors 102, 104, and 106 coupled in parallel and three NMOS transistors 112, 114, and 116 coupled in series. The three-input stacked NAND gate 100 is merely illustrative, because stack NAND gates in a critical path of a microprocessor may comprise up to at least sixteen inputs. In a stacked NAND circuit, the $V_{DS}$ for each NMOS transistor is typically much less than the supply voltage, especially for the second and third transistors 114 and 116. Since the associated hot carrier effects are smaller due to a smaller electric field, the performance of NMOS transistors 112, 114, and 116 can be improved by reducing their channel lengths as much as possible while maintaining respective device lifetimes within acceptable norms, commonly specified at five or ten years. Since the $V_{DS}$ for each NMOS transistor 112, 114, and 116 is different from the others, performance and reliability can be improved by using different channel lengths for the transistors. For example, NMOS transistors 112, 114, and 116 may have channel lengths of 0.25 micron, 0.225 micron, and 0.2 micron, respectively. NMOS transistor 112 has the greatest potential difference, $V_{DS}$, across it and hence the longest channel length.

In microprocessor design, it is desirable to accurately predict the performance and reliability of the sub-minimum channel transistors in the stacked NAND gates in the critical path of the microprocessor. However, stacked NAND gates and other critical path circuitry are not easily found or readily available as test structures for evaluating hot carrier effects.

SUMMARY OF THE INVENTION

There exists a need for accurately predicting the performance and hot carrier reliability of circuitry including stacked NAND gates with sub-minimum channel length transistors. There is also a need for a testing methodology that can use readily available test structures.

These and other needs are met by the present invention, which evaluates a circuit by simulation, using a transistor model calibrated by empirical data from a ring oscillator experiment. Ring oscillators are readily available test structures, and calibrating a transistor model in a hot carrier reliability simulation of an integrated circuit enables more accurate prediction of the performance and reliability of the circuit.

Accordingly, one aspect of the invention is a method of analyzing an integrated circuit, such as a critical path for a microprocessor that includes a stack NAND gate having two or more NMOS transistors coupled in series, each with a channel length less than 0.5 micron, preferably less than 0.25 micron. The method comprises the step of fabricating one or more ring oscillators according to the fabrication technology of the integrated circuit. The method further comprises measuring reliability data, e.g. frequency degradation over time, from operating the one or more ring oscillators, calibrating a transistor model based on the reliability data, and simulating the integrated circuit according to the calibrated transistor model. Preferably, the reliability data is measured for a plurality of different stress voltages and channel lengths.

According to another aspect of the invention, a test system for analyzing an integrated circuit to be fabricated according to a given fabrication technology comprises a circuit simulator, such as a computer programmed with simulation software, for simulating the integrated circuit according to an aged transistor model. The system includes one or more ring oscillators fabricated on a wafer, preferably with the integrated circuit, according to the given technology. A measurement system can be coupled to one of the ring oscillators for measuring reliability data, such as frequency degradation over time, from operating the ring oscillator for a prescribed period of time. A calibration system is configured to calibrate the aged transistor model based on the reliability data.

Additional objects, advantages, and novel features of the present invention will be set forth in part in the description which follows, and in part, will become apparent to those skilled in the art upon examination or may be learned by practice of the invention. The objects and advantages of the invention may be realized and obtained by means of the instrumentalities and combinations particularly pointed out in the appended claims.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENT

A method and system for analyzing the performance and hot carrier reliability of an integrated circuit are described. In the following description, for purposes of explanation, numerous specific details are set forth in order to provide a thorough understanding of the present invention. It will be apparent, however to one skilled in the art that the present invention may be practiced without these specific details. In other instances, well-known structures and devices are shown in block diagram form in order to avoid unnecessarily obscuring the present invention.

Hot Carrier Reliability Computer Simulation

Figure 6:
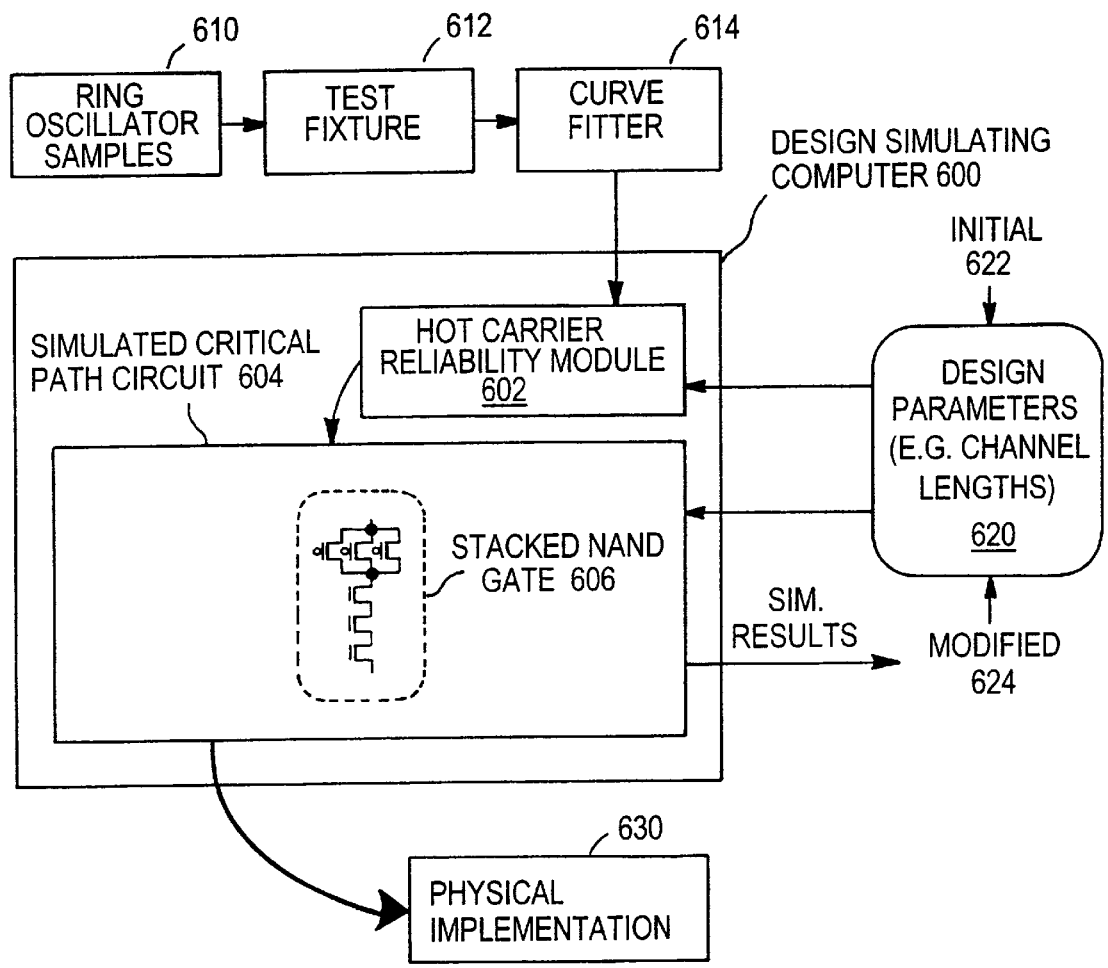
FIG. 6 illustrates a test system according to an embodiment of the present invention.

With reference to FIG. 6, an embodiment of the present invention employs a hot carrier reliability computer simulation, implemented on a programmed design simulating computer 600. Computer simulation is advantageous in the design and manufacture of integrated circuits, because design parameters 620, e.g., gate widths and channel lengths of transistors, from an initial design 622, can be adjusted relatively inexpensively (as modified parameters 624) within an simulation environment until desired results are obtained within that environment. The resulting design 604 is then physically fabricated in an integrated chip or other physical implementation 630. Examples of software simulation packages include HSpice™ from Meta-Software, Inc. of Calif., or other "Spice"-type circuit simulators that are common in the industry and the BeRT™ reliability tool package from Berkeley Technology Associates of Calif.

According to the invention, an integrated circuit is analyzed using a circuit simulator that employs an aged transistor model 602 for analyzing hot carrier reliability over time. An aged transistor model describes the behavior of a transistor over stress time, thus allowing for hot carrier degradation effects to be taken into account. In one embodiment, an aged transistor model contains stress time-dependent transistor parameters derived from repeatedly applying a BSIM (Berkeley Short-Channel IGFET Model) method once to fresh and stressed transistor devices. Alternatively, other appropriate methods for modeling a transistor may be used.

An aged transistor model is produced according to one of these methods by measuring the I-V characteristics of a fresh transistor device, e.g. substrate current ($I_{SUB}$), drive current ($I_D$), gate voltage ($V_G$), and source-to-drain voltage ($V_{DS}$). The fresh transistor device is then aged by repeatedly applying a DC stress voltage for a plurality of time periods, after each of which the I-V characteristics of the device are measured again. This process is repeated for other stress voltages, which are typically greater than the normal operating voltage of the device in order to obtain a degradation detectable within a reasonable period of time, e.g. within 500–1000 hours. These sets of I-V curves are applied to a computer simulation model for ascertaining the transistor model parameters.

The lifetime τ of a device is defined to be the time at which the percent degradation of the drive current due to hot carrier effects attains 10%. According to a well-known substrate current model, the lifetime τ of an NMOS transistor of a given channel length is also expressed by the following formula:

$$\tau = \frac{HW}{I_D} \left( \frac{I_{SUB}}{I_D} \right)^{-m} \quad (1)$$

where W represents the width of the gate, H represents an empirical coefficient related to the manufacturing condition of the device, and m represents an empirical index correlated to impact ionization and generation of interface energy levels. Therefore, it is possible to estimate the lifetime of each NMOS device in an integrated circuit within a simulation environment by using equation (1) with H and m appropriately calibrated based on experimental results.

If H and m are calibrated based on results of the DC stress test, the results of equation (1) may not match the actual degradation of an NMOS transistor in a stacked NAND gate, because the quasi-static approach of the DC stress test may not be valid under AC conditions. The DC stress model, furthermore, ignores additional factors, such as the contribution of PMOS transistors in the NAND gate. Therefore, it is desirable to calibrate these parameters according to AC stress conditions, preferably with readily available test structures.

Using a Ring Oscillator Experiment to Calibrate a Hot Carrier Reliability Simulation A method of analyzing a circuit 604 including stacked NAND gate 606 uses a computer simulation calibrated by empirical data derived from an AC stress experiment on a ring oscillator 610 in accord with the invention. More specifically, the ring oscillator experiment provides data for more accurately calibrating computer simulation parameters, such as H and m.

Figure 1:
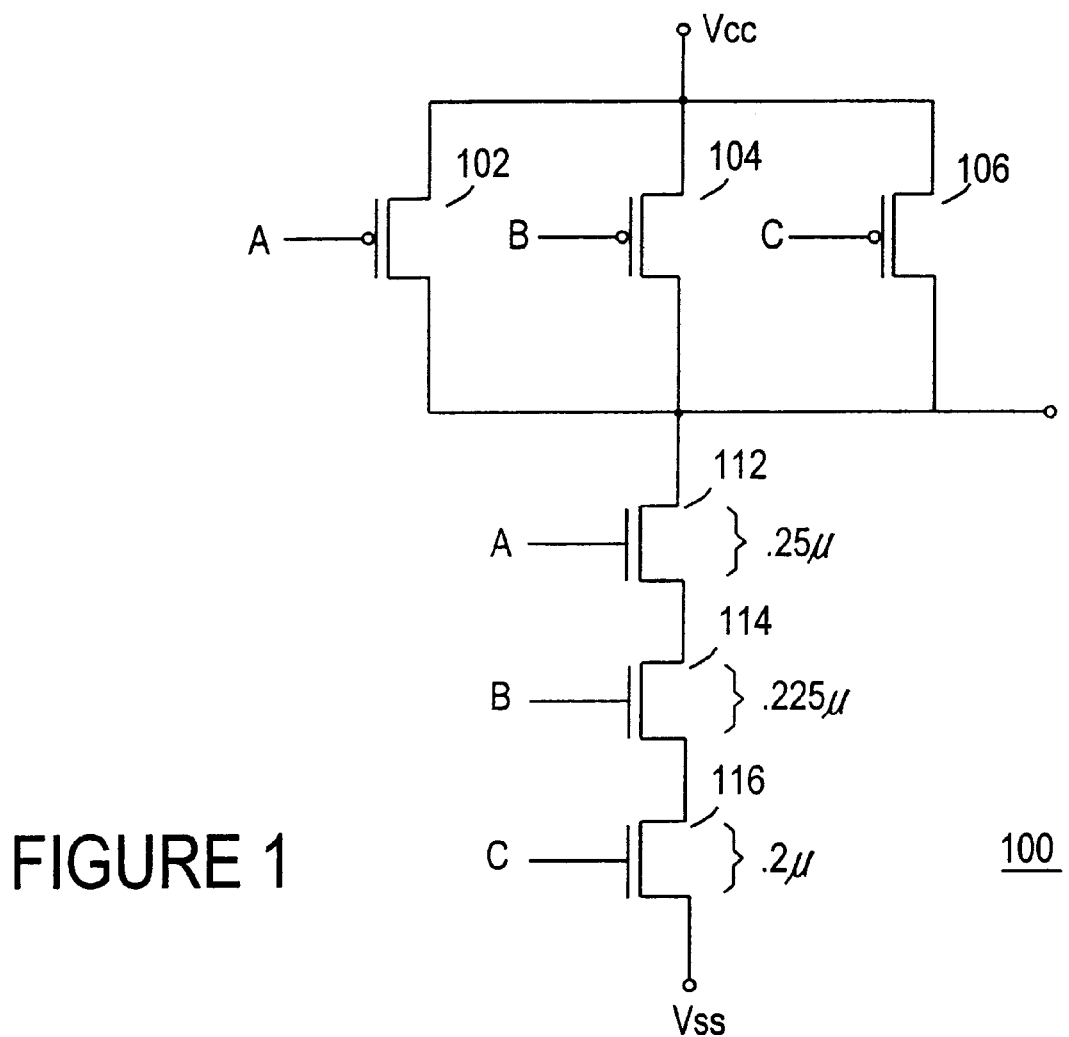
FIG. 1 is a diagram of a stacked NAND gate tested by the invention.
Figure 2:
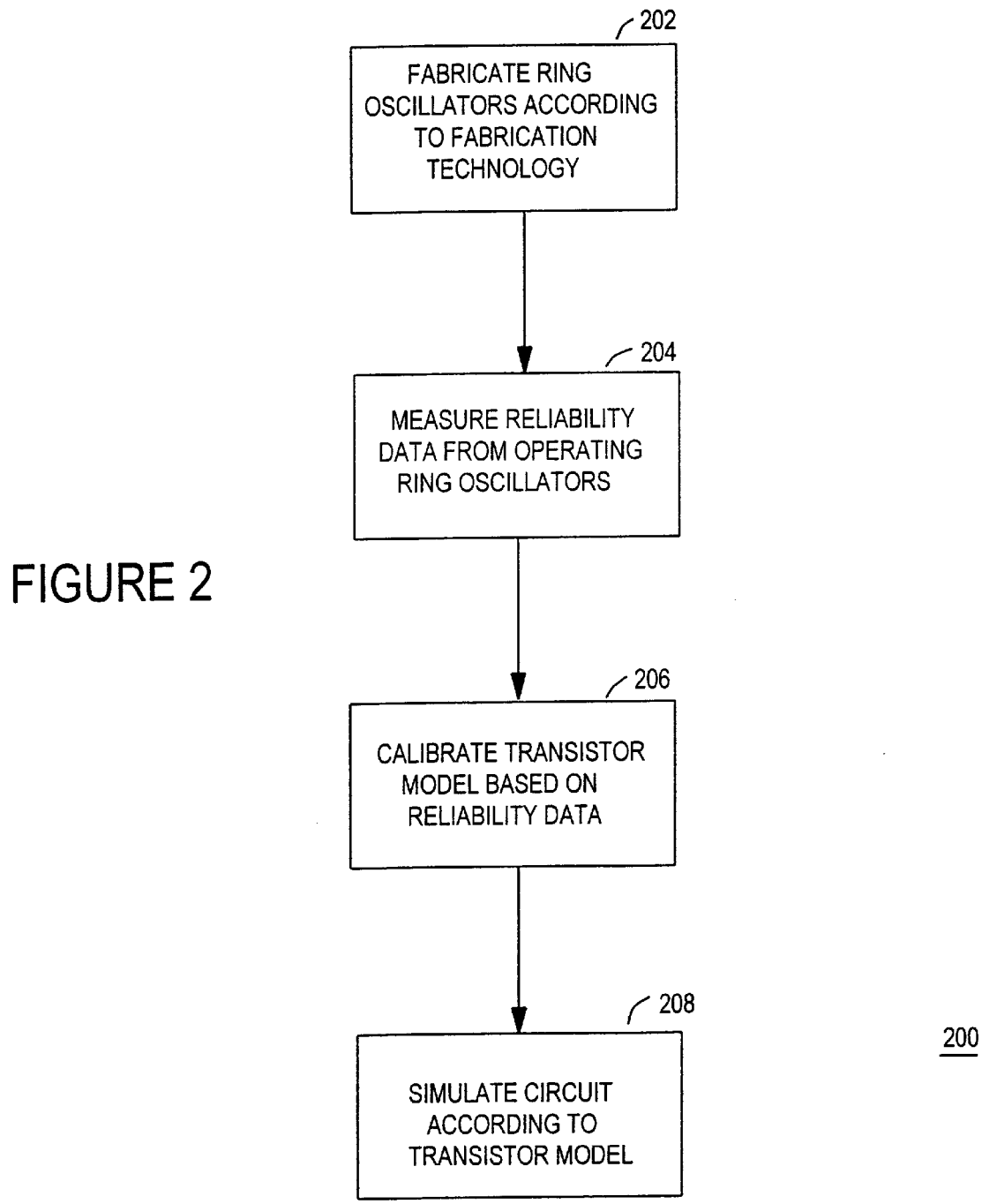
FIG. 2 is a flowchart illustrating the steps of a testing methodology according to one embodiment.

Referring to flowchart 200 of FIG. 2, one or more ring oscillators are fabricated in step 202 as test structures according to the same fabrication technology as implemented for the integrated circuit, e.g. a microprocessor, including a stacked NAND gate. These experimental ring oscillators may be manufactured on a portion of the same wafer of the integrated circuit under analysis so that processing variations similarly affect both the text structure and the batch. Preferably, a plurality of ring oscillators is fabricated so that a plurality of AC stress experiments can be performed with different combinations of stress voltages and channel length geometries.

Figure 3:
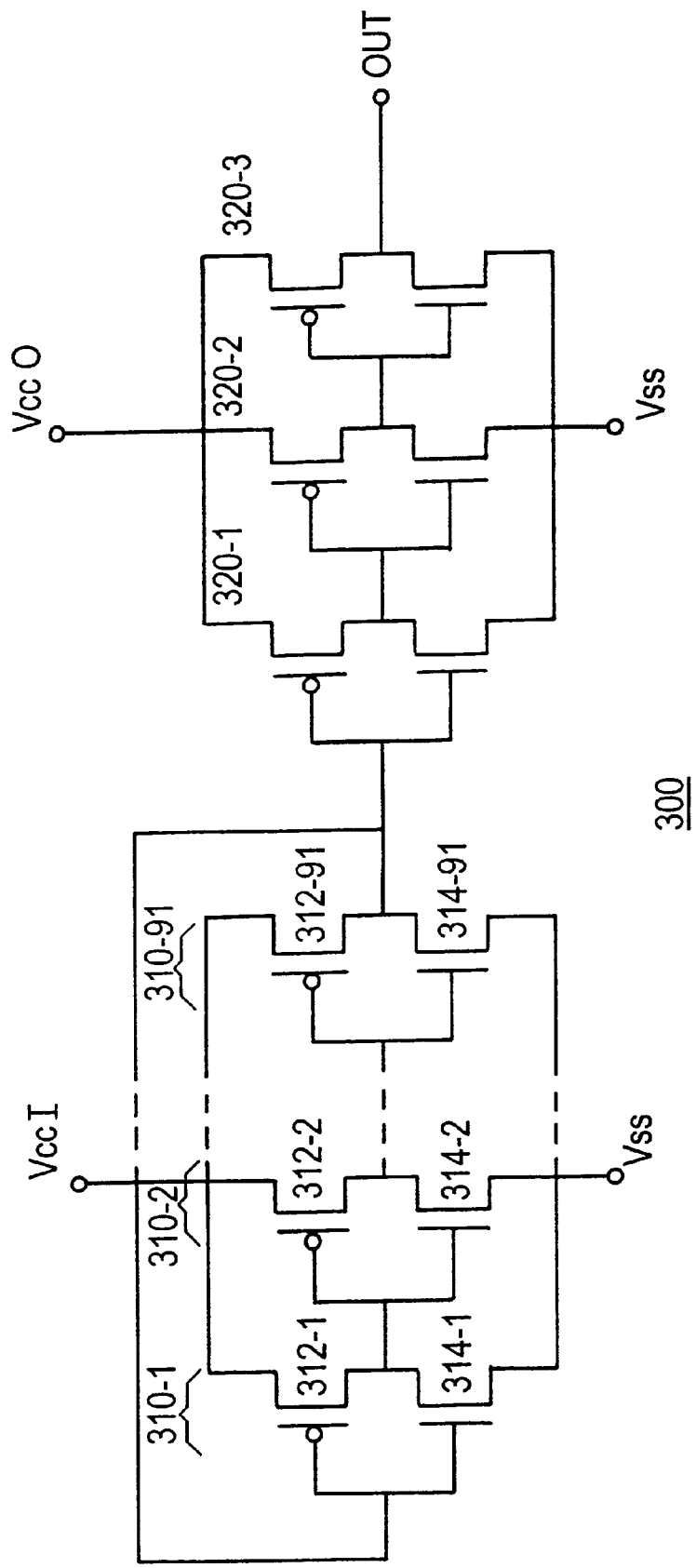
FIG. 3 is a diagram of a ring oscillator implemented according to an embodiment of the present invention.

Referring to FIG. 3, depicted are portions of a 91-stage simple inverter based ring oscillator 300 according to one embodiment of the present invention. Persons of skill in the art will appreciate that implementation of the present invention is not limited to ninety-one (91) stages but may include any number of stages preferably odd, such as seventy-one (71), and one hundred one (101). Moreover, those skilled in the art will recognize that the number of output stages 320-1 to 320-3 can vary, for example, one, two, three, or more.

Each stage of the ring oscillator preferably comprises a simple inverter. For example, stage 310-1 comprises a CMOS inverter including a PMOS transistor 312-1 and an NMOS transistor 314-1. Likewise, the other ring oscillator stages, 310-2 to 310-91, comprise CMOS inverters including PMOS transistors 312-2 to 312-91 and NMOS transistors 314-2 to 312-91, respectively. The channel lengths of the NMOS transistors 314-1 to 314-91 of ring oscillator 300 are the same, preferably the same length as channel lengths of an NMOS transistor of a stacked NAND gate under analysis. However, other ring oscillators in the batch may employ NMOS transistor having a different, common channel length.

Each inverter of the ring oscillator stages 310-1 to 310-91 receives a common supply voltage $V_{ccI}$. The common supply voltage is generally greater than the normal operating voltage of the integrated circuit and remains constant throughout an AC stress experiment. Other AC stress experiments, however, on other ring oscillators will employ a different common supply voltage, as described in more detail hereinafter. The common supply voltage ($V_{ccO}$) for output stages 320-1 to 320-3, preferably CMOS inverters with non-sub-minimum channel lengths, is lower to reduce the hot carrier effects on the output stage.

Figure 4:
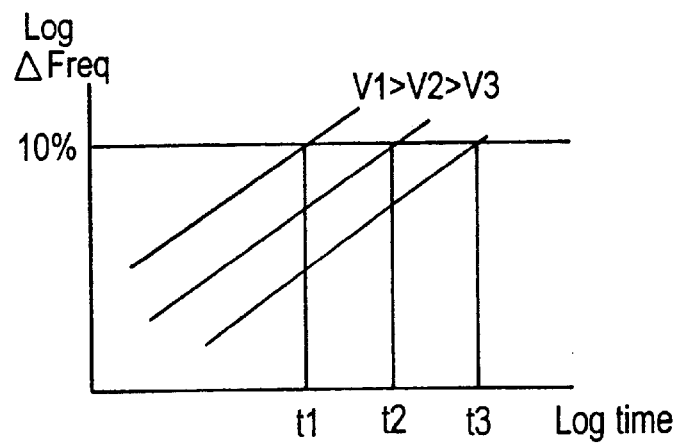
FIG. 4 is a graph showing frequency degradation of a ring oscillator over time.

After the ring oscillators are fabricated, an AC stress experiment is performed on a ring oscillator. Preferably, a plurality of AC stress experiments can be performed with different combinations of stress voltages, e.g 3.3V and 5.5V, and channel length geometries. e.g. 0.25 micron, 0.225 micron, and 0.2 micron. When each AC stress experiment on a ring oscillator is performed, the ring oscillator is set running at a given stress voltage, $V_{ccI}$. When the ring oscillator is running, the frequency is continually measured, for example, by a frequency measurement system or other test structure 612 coupled to an output of the final output stage 320-3. Over time, the frequency will slow down due to hot carrier effects, and the elapsed time, i.e. the lifetime τ, when frequency degradation reaches 10% is recorded. FIG. 4 depicts a log-log graph showing a relationship between the frequency degradation on the y-axis and the elapsed time on the x-axis for a plurality of stress voltages V1 to V3. For example, a plot of the frequency degradation versus elapsed time for stress voltage V1 crosses the 10% degradation line when the elapsed time is t1. Accordingly, t1 is recorded as the lifetime $τ_1$ for the stress voltage V1.

Figure 5:
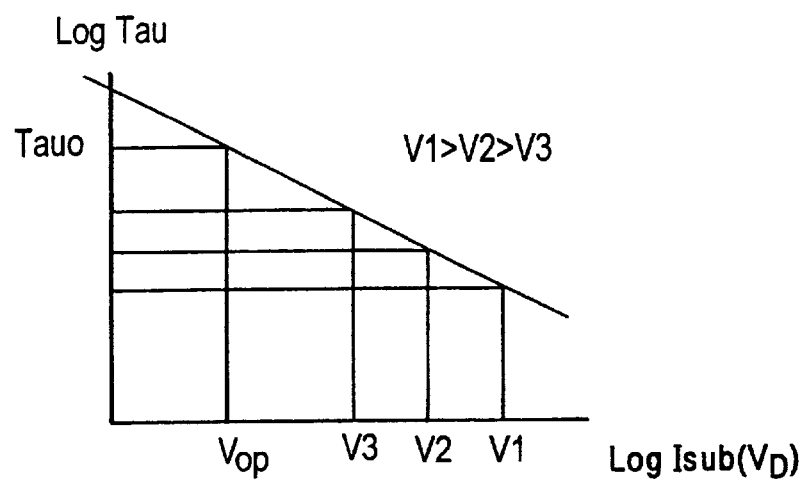
FIG. 5 is a graph showing a relationship between lifetime and substrate current in an integrated circuit.

In step 206, the transistor model is calibrated based on the recorded reliability data. Specifically, the measured lifetimes from AC stress experiments on ring oscillators employing the same channel length are compared against corresponding substrate currents, derived from respective stress voltages based on I-V curves measured during the DC stress tests. FIG. 5 depicts a log-log graph showing a relationship between measured lifetimes $τ_i$ and substrate currents $I_{SUB}$. From this graph, the constants H and m of the computer simulation can be fine-tuned. With some algebraic manipulation to equation (1), the lifetime τ is related to the substrate current as follows:

$$\tau \frac{I_D}{W} = H\left(\frac{I_{SUB}}{I_D}\right)^{-m} \quad (2)$$

Taking the logarithm of each side yields:

$$\log\left(\tau \frac{I_D}{W}\right) = -m\log\left(\frac{I_{SUB}}{I_D}\right) + \log H \quad (3)$$

Therefore, plotting lifetime versus substrate current (suitably multiplied by constant factors such as the drive current at a given stress voltage and time and gate width) on a log-log graph yields a line having a slope of −m and a y-intercept of log H. Therefore, the values of m and H can be calibrated for a computer simulation according the measured reliability data from an AC stress test. Suitable values for m and H may be obtained, for example, from the experimental data by a calibration system such as a computer programmed for curve fitting operations 614 to find a linear fit, for example a least-square linear fit in a known manner. The computer programmed for curve fitting 614 may be the same computer as the design simulating computer 600 or may be a different computer. The reliability data from AC stress experiments on ring oscillators employing other channel lengths is also used to calibrate the parameters, i.e., channel length, of transistors with that geometry.

After the computer model has been calibrated by the procedure described hereinabove, the integrated circuit 604 including stacked NAND gates 606, for example a critical path of a microprocessor, is simulated using the computer model. During, or after the simulation, an integrated circuit designer is able to determine the reliability, i.e. hot carrier lifetime, and performance of the integrated circuit. Specifically, the designer is able to easily modify design parameters 624, especially the channel lengths of the stacked NMOS transistors, to ascertain whether the modification improves the reliability, or performance of the integrated circuit.

While this invention has been described in connection with what is presently considered to be the most practical and preferred embodiment, it is to be understood that the invention is not limited to the disclosed embodiment, but on the contrary, is intended to cover various modifications and equivalent arrangements included within the spirit and scope of the appended claims.

What is claimed is:

1. A method of analyzing an integrated circuit, said integrated circuit to be fabricated according to a given fabrication technology, said method comprising the steps of:
    fabricating a plurality of simple inverter-based ring oscillators according to the given fabrication technology, each of the simple inverter-based ring oscillators including transistors of a different, corresponding channel length;
    measuring reliability data from operating the simple inverter-based ring oscillators;
    calibrating a transistor model based on the reliability data; and
    simulating said integrated circuit according to the calibrated transistor model, wherein said integrated circuit includes a stacked NAND gate having a plurality of NMOS transistors with different channel lengths less than or equal to about 0.5 micron coupled in series.

2. The method of claim 1, wherein the step of measuring reliability data from operating the ring oscillators includes the step of measuring frequency degradation of the ring oscillators for a prescribed operation time.

3. The method of claim 1, wherein the step of measuring reliability data from operating the ring oscillators includes the step of measuring the reliability data for a plurality of different stress voltages applied to the oscillators.

4. The method of claim 1, wherein the step of calibrating a transistor model based on the reliability data includes the step of calibrating an aged transistor model of hot carrier degradation based on the reliability data.

5. The method of claim 1, wherein the different channel lengths are between about 0.20 and 0.25 microns.

6. The method of claim 1, wherein the step of simulating the integrated circuit according to the calibrated transistor model includes the step of simulating a critical path circuit of a microprocessor according to the calibrated transistor model.

7. A method of analyzing a critical path circuit of a microprocessor, said critical path circuit including a stacked NAND gate having a plurality of NMOS transistors with different channel lengths less than about 0.5 micron coupled in series, said critical path circuit to be fabricated according to a given fabrication technology, said method comprising the steps of:

fabricating a first plurality of simple inverter-based ring oscillators including first NMOS transistors with a first common channel length according to the given fabrication technology;

fabricating a second plurality of simple inverter-based ring oscillators including second NMOS transistors with a common second channel length different from the first common channel length according to the given fabrication technology;

measuring first frequency degradation data over time for a first plurality of different stress voltages from operating the first plurality of simple inverter-based ring oscillators, respectively;

measuring second frequency degradation data over time for a second plurality of different stress voltages from operating the second plurality of simple inverter-based ring oscillators;

calibrating an aged transistor model of hot carrier degradation based on the first and second frequency degradation data; and simulating the critical path circuit according to the calibrated, aged transistor model.

8. A test system for analyzing an integrated circuit to be fabricated according to a given fabrication technology, said test system comprising:

a circuit simulator for simulating the integrated circuit according to an aged transistor model, wherein the integrated circuit includes a stacked NAND gate having a plurality of NMOS transistors with different, submicron channel lengths, said plurality of NMOS transistors coupled in series;

a plurality of simple inverter-based ring oscillators fabricated on a wafer according to the given technology, each of the simple inverter-based ring oscillators including transistors of a different, corresponding channel length;

a measurement system couplable to said each of the ring oscillators for measuring reliability data from operating the ring oscillators for a prescribed period; and a calibration system for calibrating the aged transistor model based on the reliability data.

9. The test system of claim 8, wherein the measurement system includes a frequency measurement system for measuring frequency degradation over time of said each of the ring oscillators.

10. The test system of claim 8, wherein the circuit simulator includes a computer programmed to simulate the integrated circuit.

11. The test system of claim 8, wherein the wafer includes the integrated circuit fabricated thereon according to the given technology.

12. The test system of claim 11, wherein the integrated circuit includes transistors interconnected in a prescribed manner in a critical path.

* * * * *